United States Patent
Zhang et al.

(10) Patent No.: US 7,586,757 B2
(45) Date of Patent: Sep. 8, 2009

(54) MOUNTING APPARATUS FOR EXPANSION CARDS

(75) Inventors: Jun-Xiong Zhang, Shenzhen (CN); Jia-Qi Fu, Shenzhen (CN); Zhi-Xin Li, Shenzhen (CN)

(73) Assignees: Hong Fu Jin Precision Industry (ShenZhen) Co., Ltd., Shenzhen, Guangdong Province (CN); Hon Hai Precision Indsutry Co., Ltd., Tu-Cheng, Taipei Hsien (TW)

( * ) Notice: Subject to any disclaimer, the term of this patent is extended or adjusted under 35 U.S.C. 154(b) by 286 days.

(21) Appl. No.: 11/309,798

(22) Filed: Sep. 28, 2006

(65) Prior Publication Data

US 2007/0206368 A1 Sep. 6, 2007

(51) Int. Cl.
*H05K 7/14* (2006.01)
*H05K 7/18* (2006.01)

(52) U.S. Cl. .............. 361/802; 361/801; 361/683

(58) Field of Classification Search .............. 361/683, 361/686, 679, 748, 759, 752, 790, 801, 802; 312/223; 211/41.7
See application file for complete search history.

(56) References Cited

U.S. PATENT DOCUMENTS

| 4,745,524 | A   |   | 5/1988  | Patton, III         |
|-----------|-----|---|---------|---------------------|
| 5,317,483 | A   |   | 5/1994  | Swindler            |
| 5,575,546 | A   | * | 11/1996 | Radloff ...... 312/183 |
| 5,757,618 | A   | * | 5/1998  | Lee .......... 361/686 |
| 5,936,835 | A   |   | 8/1999  | Astier              |
| 6,999,311 | B1  | * | 2/2006  | Lai ........... 361/685 |
| 7,375,955 | B2  | * | 5/2008  | Xu ............ 361/683 |

* cited by examiner

*Primary Examiner*—Hung S Bui
(74) *Attorney, Agent, or Firm*—Frank R. Niranjan

(57) ABSTRACT

An exemplary mounting apparatus for an expansion card with an end plate includes a mounting bracket, and a retaining member slidably attached to the bracket. The mounting bracket includes a supporting panel having a protruding bridge extending therefrom, and a pair of flanges defining a pair of slanting railways therein. The retaining member includes a hook depending from a retaining wall, and a pair of sliding bars extending from a pair of sidewalls. The sliding bars slide along the railways to sandwich the end plate of the expansion card between the supporting panel and the retaining wall. The hook engages with the protruding bridge to lock the retaining member to the mounting bracket.

20 Claims, 5 Drawing Sheets

MOUNTING APPARATUS FOR EXPANSION CARDS

FIELD OF THE INVENTION

The present invention relates to mounting apparatuses for electronic devices, and more particularly to a mounting apparatus for expansion cards.

DESCRIPTION OF RELATED ART

Computer systems typically require or include expansion cards which extend the capabilities of computer systems by providing dedicated hardware to achieve a variety of tasks. Graphics adapters, high speed network controllers, hard disk controllers, sound cards, and modem cards are among some of the more common types of expansion cards, although those knowledgeable in the field of computer systems will recognize a wide variety of other types of expansion cards. Expansion cards are typically attached in the computer systems by screws. However, attachment with screws is unduly complicated and time consuming, particularly when several expansion cards are fixed. In addition, a tool is usually required for installation and removal of the screws.

To address aforesaid problems, a number of mounting apparatuses such as disclosed in U.S. Pat. No. 4,745,524 is invented to minimize the number of screws to be used.

What is desired, therefore, is a mounting apparatus which facilitates removal and attachment of expansion cards.

SUMMARY OF THE INVENTION

In one preferred embodiment, a mounting apparatus for an expansion card with an end plate includes a mounting bracket, and a retaining member slidably attached to the bracket. The mounting bracket includes a supporting panel having a protruding bridge extending therefrom, and a pair of flanges defining a pair of slanting railways therein. The retaining member includes a retaining wall with a hook depending therefrom, and a pair of sidewalls with a pair of sliding bars extending therefrom. The sliding bars slide along the railways to sandwich the end plate of the expansion card between the supporting panel and the retaining wall. The hook engages with the protruding bridge to lock the retaining member to the mounting bracket.

Other advantages and novel features will become more apparent from the following detailed description of a preferred embodiment when taken in conjunction with the accompanying drawings, in which:

DETAILED DESCRIPTION OF THE INVENTION

Figure 1:
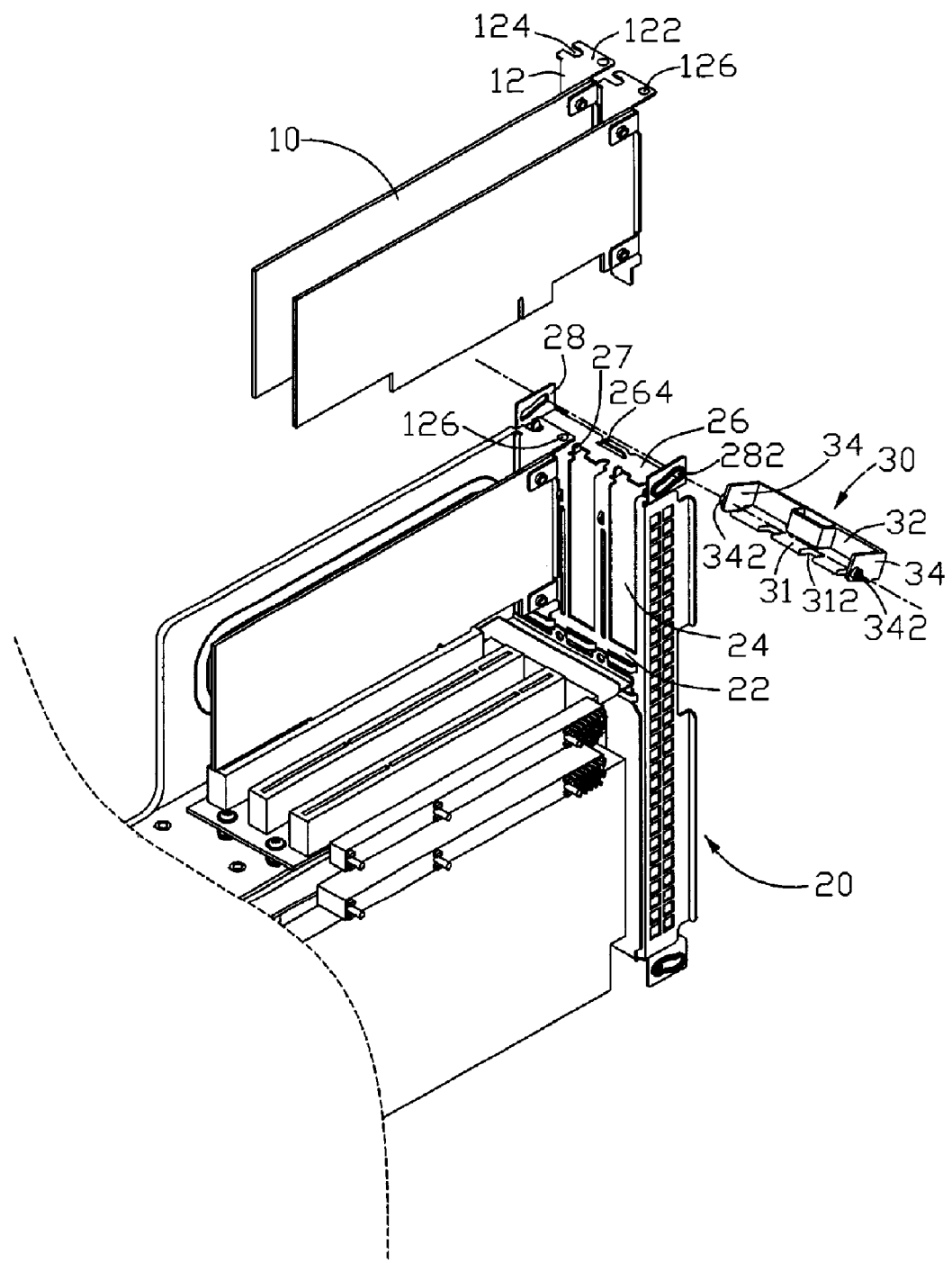
FIG. 1 is an exploded, isometric view of a mounting apparatus in accordance with a preferred embodiment of the present invention, with a plurality of expansion cards, the mounting apparatus including a retaining member.
Figure 5:
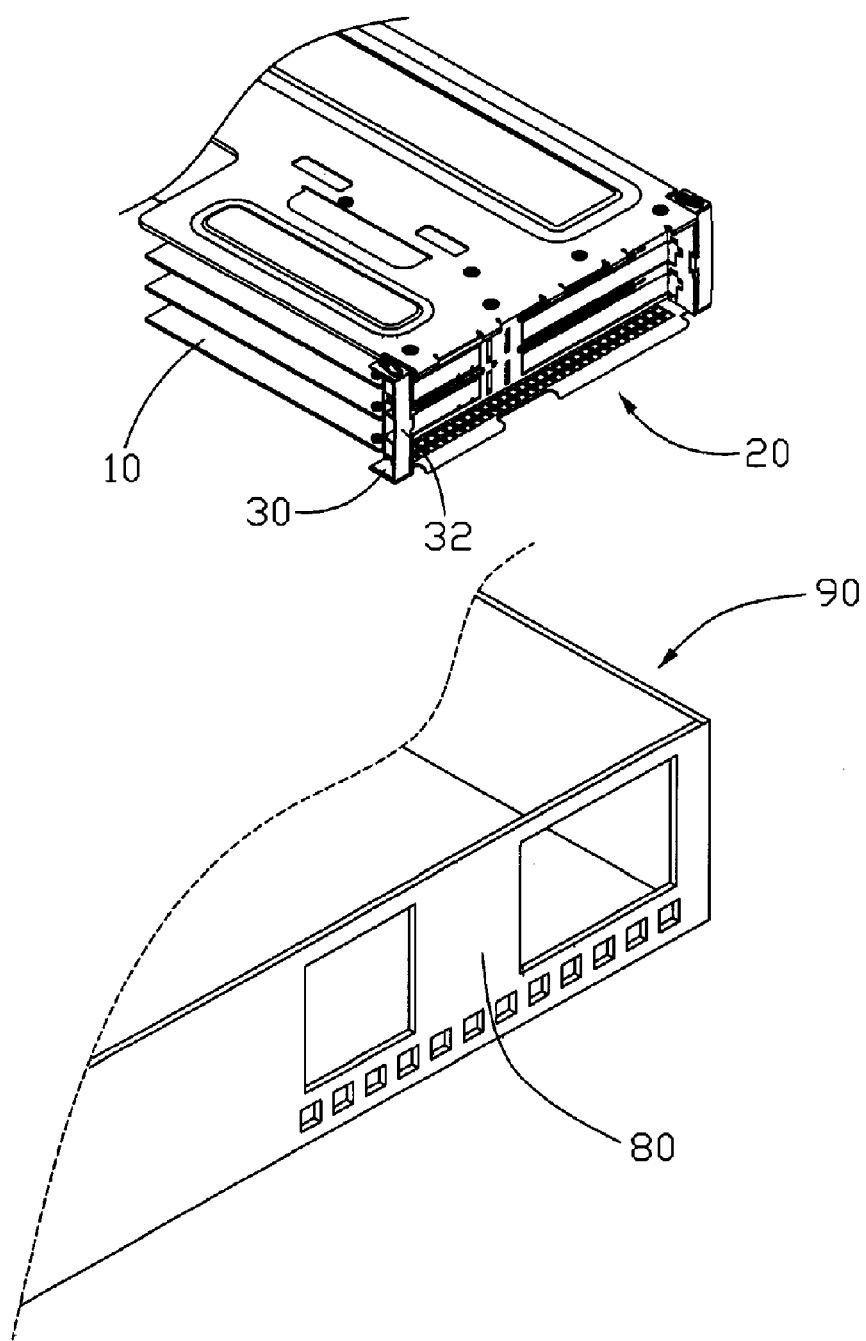
FIG. 5 is an assembled view of FIG. 1, with a chassis of an electronic device.

Referring to FIGS. 1 and 5, a mounting apparatus in accordance with a preferred embodiment is provided to fix a plurality of expansion cards 10 in a chassis 90 of a computer. The mounting apparatus includes a mounting bracket 20, and a retaining member 30. Each of the expansion cards 10 includes a generally L-shaped end plate 12 attached to an end thereof. Each of the end plates 12 includes a bent portion 122. Each of the bent portions 122 includes a notch 124, and an aperture 126 defined therein.

The bracket 20 includes a side panel 22, and a supporting panel 26 extending perpendicularly from an upper edge of the side panel 22. A plurality of slots 24 is defined in the side panel 22 and communicates with a part of the supporting panel 26. A plurality of locating tips 27 extends from a front portion of the supporting panel 26, besides an edge of each of the slots 24. A protruding bridge 264 is punched upwardly from a rear portion of the supporting panel 26. A pair of flanges 28 extends perpendicularly from two opposite ends of the supporting panel 24. A pair of railways 282 is defined in the flanges 28 respectively. Each of the railways 282 extends gradually from a bottom portion to an upper portion of the corresponding flange 28. Each of the railways 282 includes a curved retaining portion formed at a bottom distal end thereof.

Figure 2:
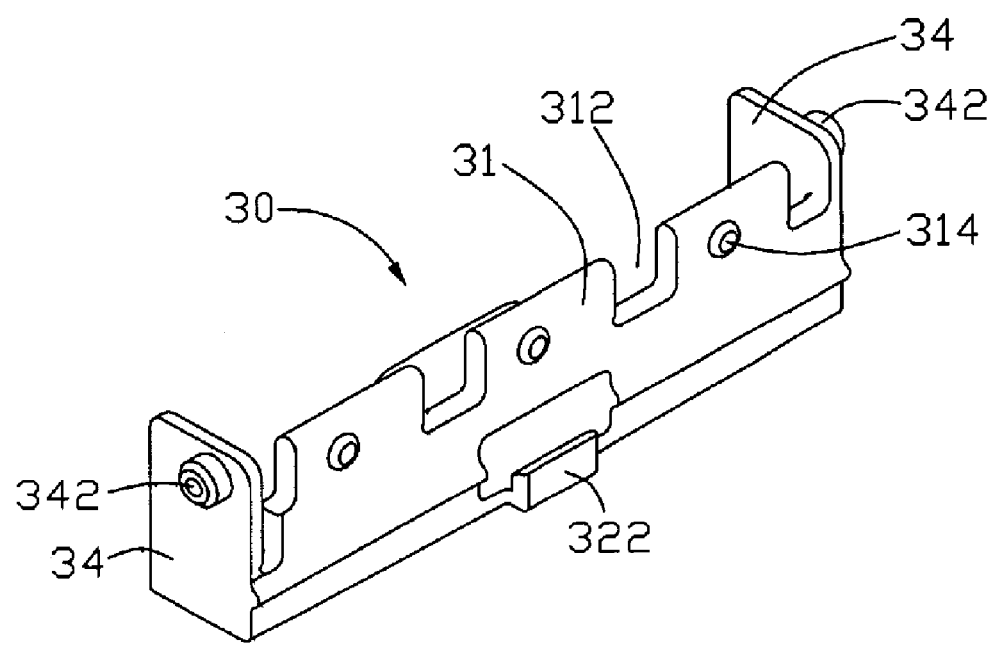
FIG. 2 is an enlarged view of the retaining member of FIG. 1, but viewed from another aspect.

Referring also to FIG. 2, the retaining member 30 includes a retaining wall 31, a pair of sidewalls 34 extending from two opposite ends of the retaining wall 31, and a connecting wall 32 perpendicularly disposed between the sidewalls 34. A plurality of cutouts 312 is defined in a front portion of the retaining wall 31, corresponding to the notches 124 of the expansion cards 10. A pair of sliding bars 342 extends outward from outer surfaces of the sidewalls 34, for slidably engaging in the railways 282 of the mounting bracket 20. A plurality of positioning protrusions 314 depends from a front portion of the retaining wall 31, corresponding to the apertures 126 of the expansion cards 10. A hook 322 extends downward from a rear portion of the retaining wall 31, to engage with the protruding bridge 264 of the mounting bracket 20.

Figure 3:
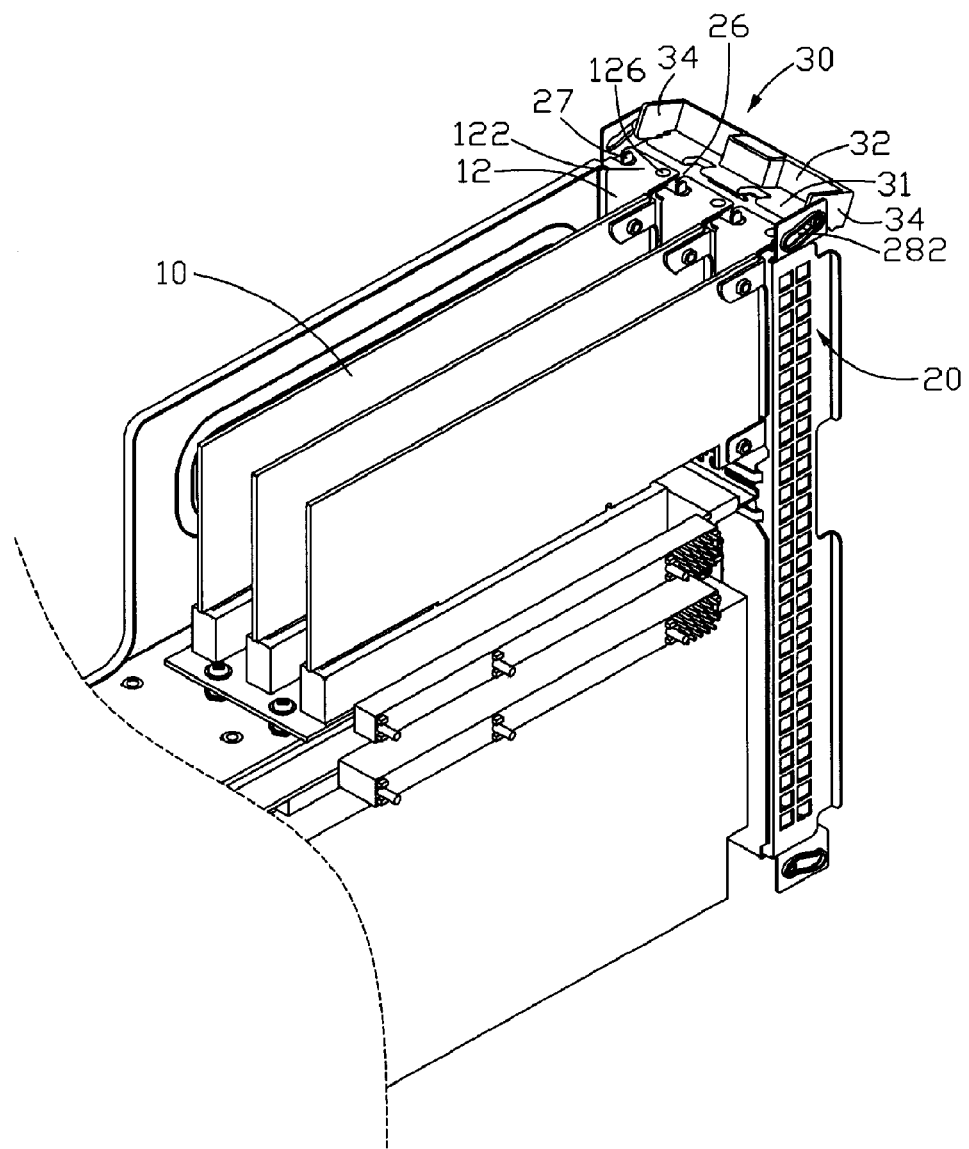
FIGS. 3 and 4 are assembled views of FIG. 1, respectively showing the expansion cards in fixed and unfixed states.
Figure 4:
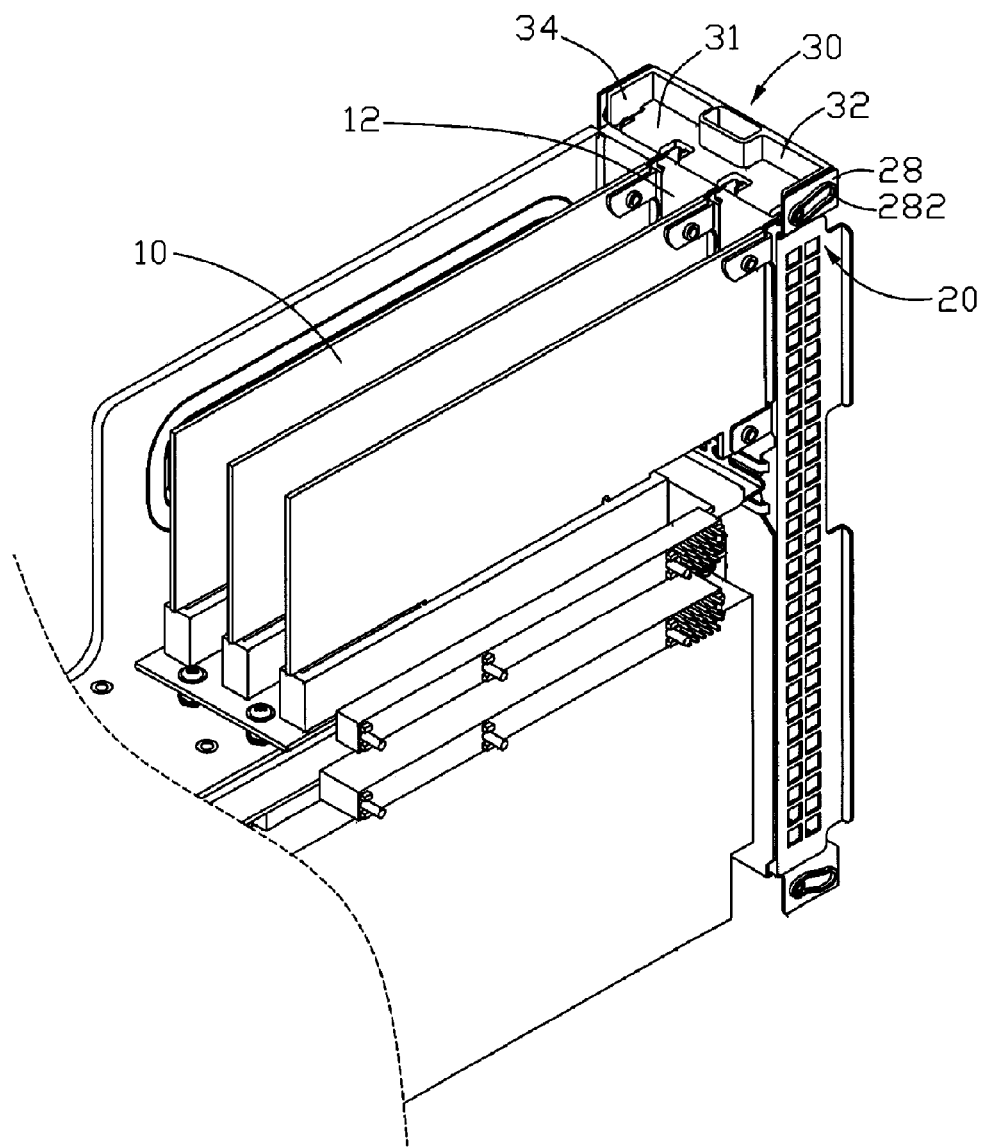

Referring to FIGS. 3 and 4, in assembly, the retaining member 30 is movably attached to the mounting bracket 20. The sidewalls 34 are squeezed to abut inside surfaces of the flanges 28 and the sliding bars 342 are received in the railways 282 of the sidewalls 34, respectively.

In use, the expansion cards 10 are attached to the mounting bracket 20, with the end plates 12 positioned at the mounting bracket 20 in alignment with the slots 24 of the side panel 22 thereof respectively. The bent portions 122 of the end plates 12 are overlapped on the supporting panel 26 and the locating tips 27 extend into the notches 124. The retaining member 30 is moved toward the mounting bracket 20 by manipulating the connecting wall 32 thereof, with the sliding bars 342 sliding along the railways 282 downward. The sliding bars 342 are located in the retaining portions of the railways 282. The bent portions 122 of the expansion cards 10 are sandwiched between the retaining wall 31 of the retaining member 30 and the supporting panel 26 of the mounting bracket 20. The locating tips 27 of the mounting bracket 20 extend into the cutouts 312 of the retaining member 30. The positioning protrusions 314 of the retaining member 30 extend into the apertures 126 of the expansion cards 10 respectively. The hook 322 of the retaining member 30 engages with the protruding bridge 264 of the mounting bracket 20. Thus, the expansion cards 10 are retained on the mounting bracket 20.

Referring also to FIG. 5, the assembled mounting bracket 20 is attached to the chassis 90. The chassis 90 includes a side plate 80 abutting the connecting wall 32 of the retaining member 30, to prevent the sliding bars 342 of the retaining member 30 moving reversely in the railways 282 of the mounting bracket 20.

To detach the expansion cards 10, the assembled mounting bracket 20 is taken out of the chassis 80. The connecting wall 32 of the retaining member 30 is drawn to disengage the hook 322 of the retaining member 30 from the protruding bridge 264 of the mounting bracket 20. The retaining member 30 is moved away from the mounting bracket 20, with the sliding bars 342 sliding along the railways 282 upward. The expansion cards 10 are ready to be removed from the mounting bracket 20.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A mounting apparatus for an expansion card having an end plate, the mounting apparatus comprising:
   a mounting bracket comprising a supporting panel, and a pair of flanges extending from the supporting panel, a pair of railways defined in the flanges, the supporting panel comprising a first locking portion; and
   a retaining member comprising a retaining wall, and a pair of sidewalls extending from the retaining wall, a pair of sliding bars extending from the sidewalls to be slidably received in the railways, wherein when the sliding bars reach ends of the railways, the retaining wall and the supporting panel sandwich the end plate of the expansion card therebetween, the retaining member comprising a second locking portion engaging with the first locking portion.

2. The mounting apparatus as claimed in claim 1, wherein the railways are slantwise defined in the flanges of the mounting bracket with respect to the supporting panel thereof.

3. The mounting apparatus as claimed in claim 1, wherein the mounting bracket comprises a side panel perpendicular to the supporting panel, a plurality of slots is defined in the side panel and communicates with a part of the supporting panel.

4. The mounting apparatus as claimed in claim 3, wherein the supporting panel of the mounting bracket comprises a plurality of locating tips extending from sides of the slots.

5. The mounting apparatus as claimed in claim 4, wherein the retaining wall of the retaining member comprises a plurality of cutouts defined in an edge portion thereof, corresponding to the locating tips of the mounting bracket.

6. The mounting apparatus as claimed in claim 3, wherein the retaining wall of the retaining member comprises a plurality of positioning protrusions depending therefrom, corresponding to the slots of the mounting bracket.

7. The mounting apparatus as claimed in claim 1, wherein the retaining member comprises a connecting wall perpendicularly disposed between the sidewalls.

8. The mounting apparatus as claimed in claim 1, wherein the first locking portion is a protruding bridge extending from the supporting panel of the mounting bracket, the second locking member is a hook depending from the retaining wall of the retaining member.

9. A computer enclosure comprising:
   a chassis comprising a side plate;
   a mounting bracket configured for holding end plates of expansion cards thereon, the mounting bracket being detachably mounted to the side plate of the chassis;
   a retaining member slidably attached to the mounting bracket and capable of sliding in a first direction to cooperate with the mounting bracket for sandwiching the end plates of the expansion cards therebetween; and
   a fixing member engagingly fixing the retaining member to the mounting bracket to retain the end plates of the expansions cards on the mounting bracket, the side plate abutting the retaining member to prevent the retaining member from sliding in a second direction reverse to the first direction, thereby keeping keep the retaining member in a locked state.

10. The computer enclosure as claimed in claim 9, wherein the mounting bracket comprises a supporting panel, the retaining member comprises a retaining wall retaining the end plates of the expansion cards on the supporting panel.

11. The computer enclosure as claimed in claim 10, wherein the mounting bracket comprises a pair of flanges extending from the supporting panel, a pair of railways is defined in the flanges, the retaining member comprises a pair of sidewalls extending from the retaining wall, a pair of sliding bars extends from the sidewalls to slidably be received in the railways.

12. The computer enclosure as claimed in claim 11, wherein the railways are slantingly defined in the flanges of the mounting bracket respective to the supporting panel thereof 13. The computer enclosure as claimed in claim 11, wherein the retaining member comprises a connecting wall perpendicularly disposed between the sidewalls, the connecting wall is perpendicular to the retaining wall to abut the side plate of the chassis.

14. The computer enclosure as claimed in claim 10, wherein the fixing member comprises a protruding bridge extending from the supporting panel of the mounting bracket, and a hook depending from the retaining wall of the retaining member.

15. The computer enclosure as claimed in claim 10, wherein the mounting bracket comprises a side panel perpendicular to the supporting panel, a plurality of slots is defined in the side panel and communicates with a part of the supporting panel.

16. The computer enclosure as claimed in claim 15, wherein the supporting panel of the mounting bracket comprises a plurality of locating tips extending from sides of the slots.

17. The computer enclosure as claimed in claim 16, wherein the retaining wall of the retaining member comprises a plurality of cutout defined in an edge portion thereof, corresponding to the locating tips of the mounting bracket.

18. The computer enclosure as claimed in claim 10, wherein the retaining wall of the retaining member comprises a plurality of positioning protrusions depending therefrom, corresponding to the slots of the mounting bracket.

19. An apparatus for mounting an expansion card in a computer chassis, comprising:
   a mounting bracket including a side panel, a supporting panel extending perpendicularly outward from the side panel, and a pair of flanges extending from the supporting panel, each flange defining a sliding railway; and
   a retaining member comprising a pair of sliding bars, and movably attached to the mounting bracket via sliding railways of the mounting bracket, the retaining member being movable between a locked position and an unlocked position along the sliding railway, the locked position being where the retaining member urges an end plate of the expansion card against the supporting panel, the unlocked position being where the retaining member disengages from the end plate, the sliding railway extending slantwise with respect to the supporting panel.

20. The apparatus of claim 19, wherein the supporting panel has an inner side portion connected with the side panel and an opposite free outer side portion, and the sliding railway ascends from a first position substantially above the inner side portion to a second position substantially above the outer side portion.

\* \* \* \* \*